(12) United States Patent
Kirchev (10) Patent No.: US 7,795,874 B1
(45) Date of Patent: Sep. 14, 2010

(54) METHOD OF ESTIMATION OF THE STATE OF CHARGE OF A LEAD-ACID BATTERY

(75) Inventor: Angel Zhivkov Kirchev, Aix-les-Bains (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/679,446

(22) PCT Filed: Oct. 10, 2007

(86) PCT No.: PCT/IB2007/004169

§ 371 (c)(1),
(2), (4) Date: Mar. 22, 2010

(87) PCT Pub. No.: WO2009/047581

PCT Pub. Date: Apr. 16, 2009

(51) Int. Cl.
*G01N 27/416* (2006.01)
*H02J 7/00* (2006.01)

(52) U.S. Cl. .................. 324/427; 324/426; 324/431; 320/132; 204/435

(58) Field of Classification Search .................. 324/427
See application file for complete search history.

(56) References Cited

U.S. PATENT DOCUMENTS 3,781,657 A * 12/1973 Dennstedt .................. 324/426
5,151,865 A 9/1992 Blessing et al.
5,288,563 A 2/1994 Saito et al.
5,304,433 A * 4/1994 Cherng .................. 429/91
6,850,038 B2 * 2/2005 Arai et al. .................. 320/132

FOREIGN PATENT DOCUMENTS

| DE | 24 37 074 A1 | 2/1976 |
| DE | 28 56 948 A1 | 6/1980 |
| EP | 0 391 106 A1 | 10/1990 |
| EP | 0 595 466 A1 | 5/1994 |

OTHER PUBLICATIONS

International Search Report issued for International Application No. PCT/IB2007/004169 on Jul. 4, 2008.

* cited by examiner

*Primary Examiner*—Edward Tso
*Assistant Examiner*—Johali A Torres Ruiz
(74) *Attorney, Agent, or Firm*—Oliff & Berridge, PLC (57) ABSTRACT

The method of estimation of the state of charge of a lead acid battery comprises measuring the open circuit voltage difference between an integrated liquid junction reference electrode and a negative battery terminal during at least one cut-off period. It further comprises determination of the sign of the current though the battery prior to cut-off and estimation of the state of charge on the basis of the open circuit voltage difference and, according to the sign of the current, respectively of a charge or a discharge calibration curve, previously determined during a calibration procedure. The cut-off period has preferably a duration of at least 5 minutes.

11 Claims, 6 Drawing Sheets

METHOD OF ESTIMATION OF THE STATE OF CHARGE OF A LEAD-ACID BATTERY

BACKGROUND OF THE INVENTION

The invention relates to a method of estimation of the state of charge of a lead acid battery comprising an integrated liquid junction reference electrode, said method comprising measuring the open circuit voltage difference between the reference electrode and a negative battery terminal during at least one cut-off period.

STATE OF THE ART

The state of charge (SOC) of a battery usually refers to the electrochemical capacity (in Ah or in % of a reference capacity value) of the battery available by a discharge at predetermined conditions as regards the discharge current, temperature, voltage limit, etc. The estimation and indication of the SOC is an important requirement in each system using electrochemical storage of energy. The state of health (SOH) of a battery refers to the irreversible capacity loss of the battery due to different degradation phenomena. Usually it is presented as the ratio between the available full capacity of the battery and some reference value, for example the nominal or the maximum capacity of the battery.

In a lead acid battery the value of the electrolyte concentration varies in a wide range, from about 20% (wt.) at the end of a discharge to about 40% (wt.) when the battery is fully charged. The concentration can also be expressed in term of electrolyte density or specific gravity. The variations of the electrolyte concentration are mainly due to the action of the sulphuric acid in the charge/discharge process. The following equations represent the chemical reactions, respectively at the positive and negative electrodes of the battery during charge of the battery:

$$PbO_2 + HSO_4^- + 3H^+ + 2e^- \rightarrow PbSO_4 + 2H_2O \qquad (1)$$

$$Pb + HSO_4^- \rightarrow PbSO_4 + H^+ + 2e \qquad (2)$$

Figure 1:
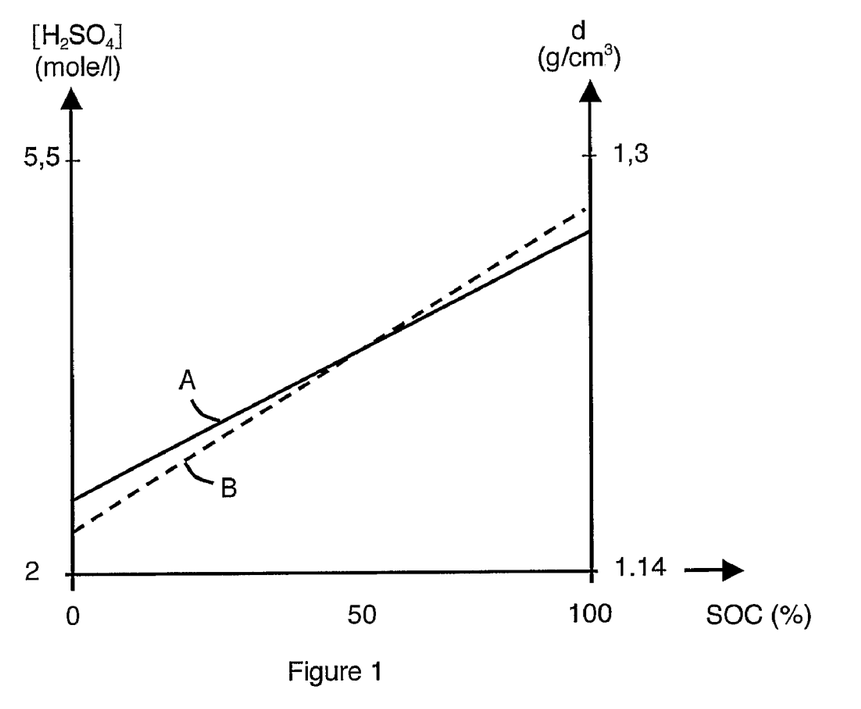
FIG. 1 schematically illustrates the variation of the molar concentration [H$_2$SO$_4$] of the electrolyte (curve A) and the electrolyte density d (curve B) versus the state of charge (SOC) of a known 50Ah lead acid battery.

Curves A and B of FIG. 1 respectively illustrate the variation of the molar concentration [$H_2SO_4$], in mole/l, of the electrolyte and the electrolyte density d, in g/cm$^3$, versus the state of charge (SOC) of the battery, in %, for a 50Ah lead acid cell containing 765 ml sulphuric acid having a density of 1.28 g/cm$^3$ in completely charged state. Both curves are nearly linear.

The SOC could thus be estimated by simple titration of an electrolyte sample from the battery, by density measurement using optical refraction or by means of an ion-concentration sensor integrated in the battery, for example as disclosed in U.S. Pat. No. 5,288,563. A substantial drawback of the direct concentration measurement is that the concentration is measured only locally. This drawback is substantial since the electrolyte concentration has classically a profile that is distributed both in a vertical direction, due to the action of the gravity causing stratification, and in an horizontal direction, more specifically due to the difference between reactions 1 and 2, leading to a markedly higher local dilution of the electrolyte at the positive plate during discharge.

The acid concentration strongly affects some electrical parameters of the battery as, for example, the open circuit voltage Vcell, which can also be used for the estimation of the state of charge of a battery. This is mainly due to the fact that, under predetermined conditions, the open circuit voltage of the lead-acid battery is close to the electromotive force E of the system Pb/PbSO$_4$//H$_2$SO$_4$//PbSO$_4$/PbO$_2$. According to the Nernst equation:

$$E = E^0 + (RT/2F)(\ln a_{H2SO4} - \ln a_{H2O}) \qquad (3)$$

wherein $E^0$ is the standard electrode potential of the electrode couple,

R is the universal gas constant: R=8.314570 J·K$^{-1}$ mol$^{-1}$,

T is the temperature in Kelvin,

F is the Faraday constant and $a_{H2SO4}$ and $a_{H2O}$ are respectively the chemical activity of H$_2$SO$_4$ and of H$_2$O.

Figure 2:
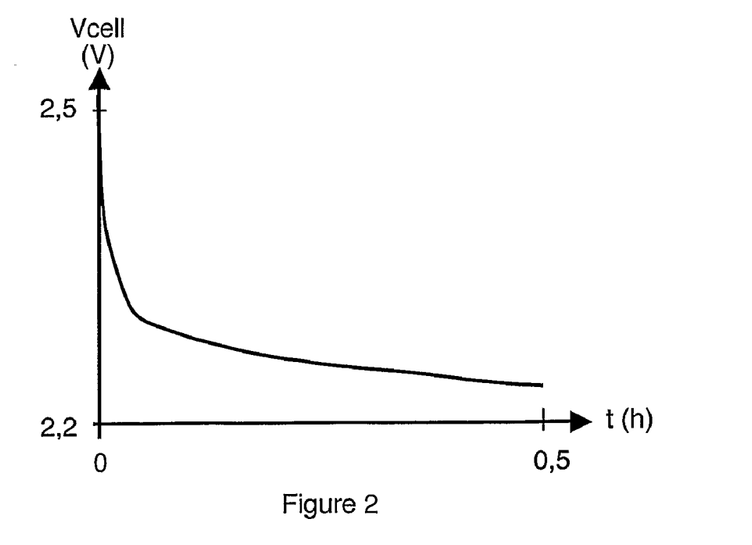
FIGS. 2 to 4 respectively illustrate, versus time, the variations of the open circuit battery voltage Vcell, positive plate voltage V+ and negative plate voltage V− after charge.
Figure 5:
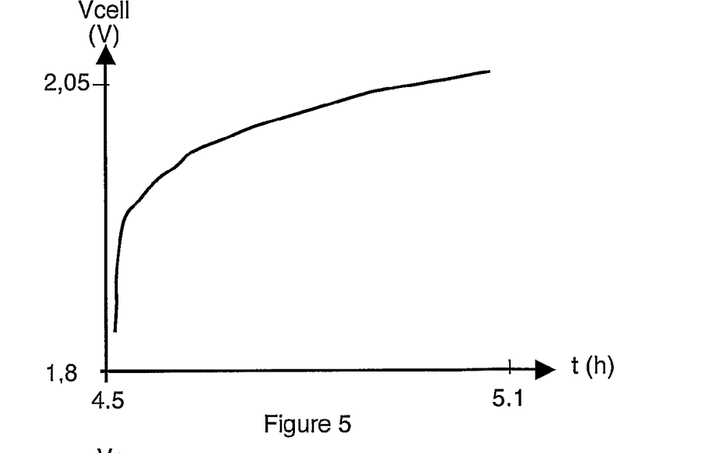
FIGS. 5 to 7 respectively illustrate, versus time, the variations of the open circuit battery voltage Vcell, positive plate voltage V+ and negative plate voltage V− after discharge.

However, the open circuit voltage Vcell reaches values close to the electromotive force E of the battery only after quite a long relaxation time after a charge or a discharge. FIGS. 2 and 5 show the variation versus time of the open circuit voltage Vcell of a lead acid cell, respectively at the end of the charge and the discharge.

Figure 3:
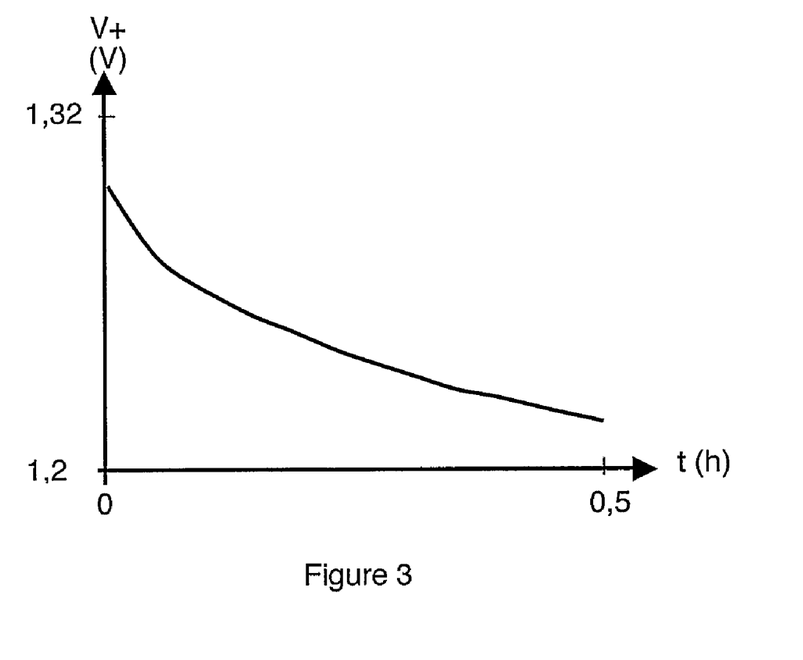
Figure 4:
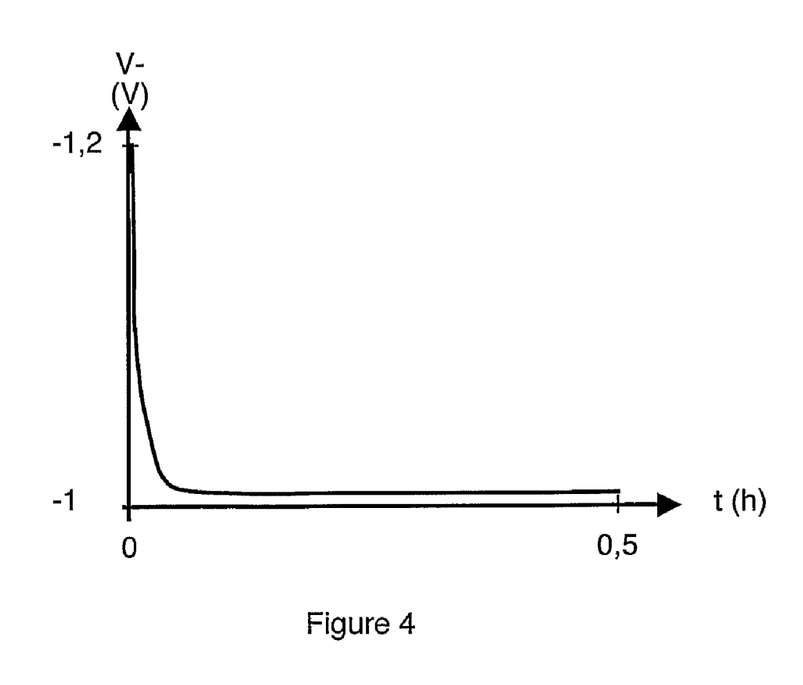
Figure 6:
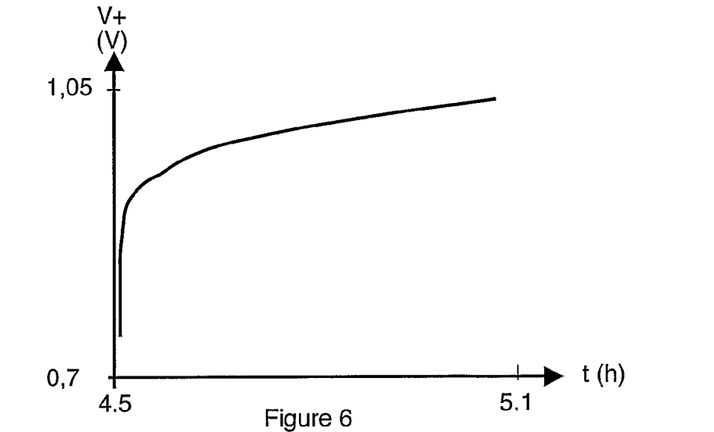
Figure 7:
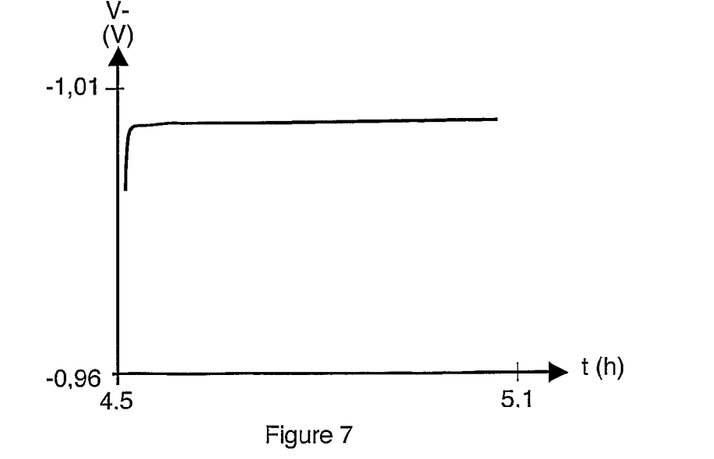

The battery voltage Vcell corresponds to the difference between the electrochemical potential of the positive plate and the electrochemical potential of the negative plate. Voltages representative of these open circuit potentials can be measured separately with respect to a same reference electrode, for example an Ag/Ag$_2$SO$_4$ reference electrode, as shown respectively at the end of the charge and of the discharge, both in open circuit conditions, in FIGS. 3 and 6 for the open circuit positive plate voltage V+ and in FIGS. 4 and 7 for the open circuit negative plate voltage V–. The negative plate voltage V– reaches a steady state value much faster than the positive plate voltage V+, both after charge (FIGS. 3 and 4) and after discharge (FIGS. 6 and 7).

This fact is used in European patent application EP-A-595466 for estimation of the state of charge of a lead acid battery using the difference between an additional PbO$_2$/PbSO$_4$ or Hg/Hg$_2$SO$_4$ reference electrode and the negative plate. The poor long-term stability of the PbO$_2$/PbSO$_4$ reference electrode makes it hardly applicable for permanent use in lead-acid cells, while the Hg/Hg$_2$SO$_4$ electrode is expensive and presents environmental hazard.

OBJECT OF THE INVENTION

The object of the invention is to overcome the drawbacks of known methods for estimation of the state of charge of a lead-acid battery and, more particularly, to increase the accuracy of this estimation.

According to the invention, this object is achieved by a method according to the appended claims and, more particularly by the fact that it further comprises determination of the sign of the current though the battery prior to cut-off and estimation of the state of charge on the basis of said open circuit voltage difference and, according to said sign, respectively of a charge or a discharge calibration curve, previously determined during a calibration procedure.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

The SOC estimation method according to the invention uses the correlation existing between the SOC and the open circuit negative plate voltage V−, i.e the open circuit voltage difference between the negative plate and a reference electrode with liquid junction, for example an $Ag/Ag_2SO_4$, $Hg/Hg_2SO_4$ or $Cu/CuSO_4$ reference electrode.

The negative plate voltage V− corresponds to the potential difference $\Delta E$ between the $Pb/PbSO_4$ negative electrode and the $Ag/Ag_2SO_4$ or $Hg/Hg_2SO_4$ reference electrode, given by the equation:

$$\Delta E = \Delta E^0 (RT/2F)(2t_+ - 1)(\ln a_{HSO4-}^{cell} - \ln a_{HSO4-}^{RE}) = \Delta E^0 + Ej \quad (4)$$

wherein $t_+$ is the $H^+$ transport number, $a_{HSO4-}^{cell}$ and $a_{HSO4-}^{RE}$ are the chemical activities of $HSO4^-$ respectively in the lead-acid cell and in the reference electrode, $\Delta E^0$ is the difference between the standard electrochemical potentials of the negative and reference electrodes and Ej is the junction potential, i.e. the potential of the liquid junction between the reference electrode and the battery electrolyte.

$\Delta E^0$ depends only on the temperature, while the junction potential Ej varies with the concentration difference on both sides of the liquid junction. Thus the junction potential Ej could theoretically be used as a parameter representative of the state of charge of the lead-acid cell, if the acid density of the reference electrode is kept constant. While equation (4) is valid only when the system is in thermodynamic equilibrium, it could nevertheless be considered as a good approximation when the system has reached a steady state.

Figure 8:
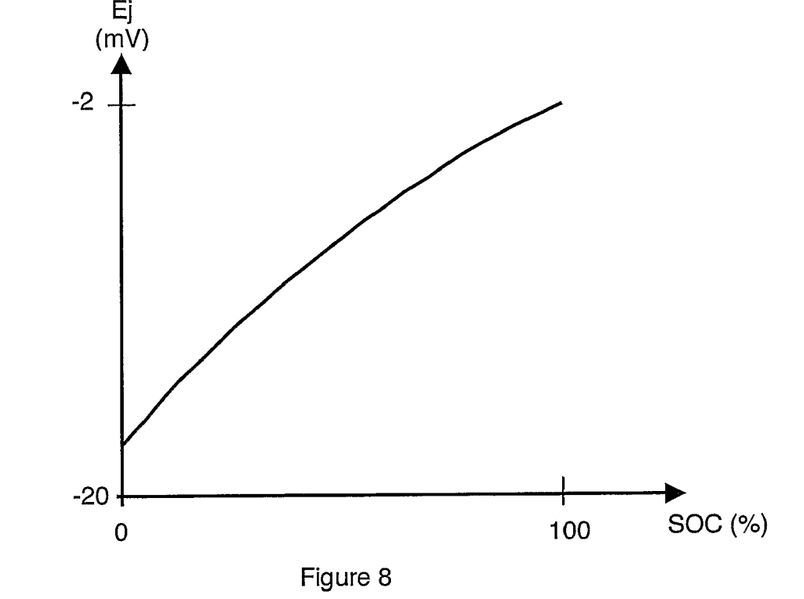
FIG. 8 illustrate the variations of the calculated junction potential Ej versus SOC of the above-mentioned 50Ah lead acid battery.

However, in practice, equation (4) is hardly satisfied even after quite a long period in the open circuit state and the calculated dependence of SOC as a function of the junction potential Ej, as shown in FIG. 8, cannot be used as a criterion for the SOC estimation. This is mainly related to the fact that three types of phenomena take place at the negative plate after cut-off, whether after a charge or after a discharge. First, a fast self-discharge or self-recharge of the electrochemical double layer, classically formed at the electrode level during cell operation, corresponds to an initial fast potential decay (after a charge) or rise (after a discharge), connected with fast equalization of the electrolyte concentration in the pores of the electrode plate. Then, a much slower change in the open circuit potential is due to the equalization of the whole electrolyte in the cell and, last, self discharge of the $Pb/PSO_4$ negative electrode takes place.

Figure 9:
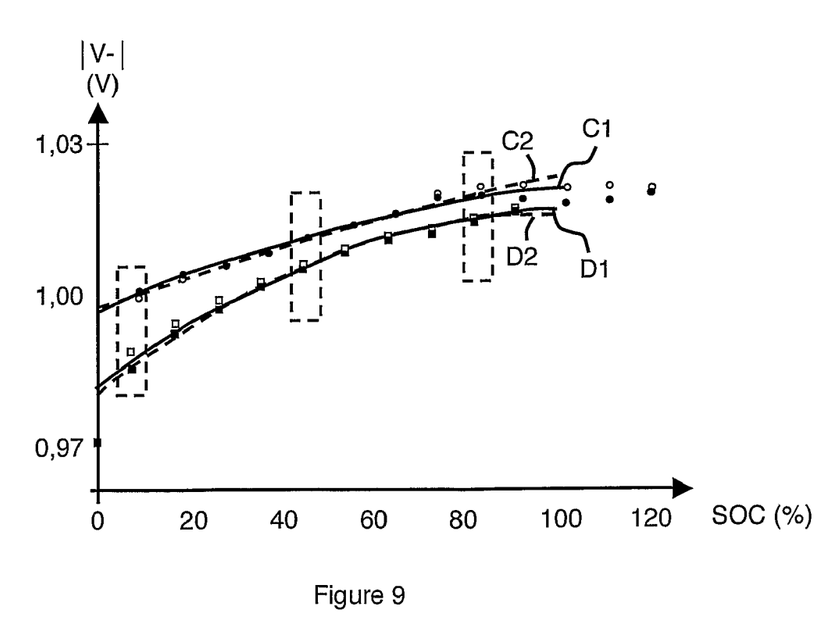
FIG. 9 illustrate versus SOC the absolute value |V−| of the negative plate voltage of the lead acid battery under different charge and discharge conditions as well as four calibration curves (C1, C2, D1, D2) used in an estimation method according to the invention.

This problem is shown in FIG. 9 illustrating versus SOC the absolute value |V−| of the open circuit negative plate voltage of a lead acid battery. In FIG. 9, square dots and round dots correspond to open circuit negative plate voltage values respectively measured after a discharge and after a charge of the lead acid battery. The white and black dots (whether square or round) correspond to values measured respectively 1 h after a discharge or a charge and 5 min after a discharge or a charge.

A hysteresis remains even after period of 1 h between the curves corresponding to the open circuit negative plate voltage values after a charge (white round dots) and after a discharge (white square dots). However, the small difference remaining between the corresponding values measured after 5 min (black dots) and after 1 hour (white dots) shows that the steady state is already reached after 5 min. Thus, this period appears to be sufficient for a reliable estimation of the state of charge based on the negative plate voltage. If this period is shorter than 5 min, for example less than 1 min as proposed in above-mentioned European patent application EP-A-595466, the measured open circuit negative plate voltage may differ substantially from the steady state value and the SOC estimation is not reliable.

As illustrated in FIG. 9 by the above-mentioned hysteresis between values measured after a charge (round dots) and values measured after a discharge (square dots), a reliable SOC estimation furthermore requires to distinguish between these two types of values. This is obtained by determination of the sign of the current prior to its cut off, a positive sign being representative of a charge and a negative sign of a discharge. Then, the SOC can be estimated on the basis of the measured open circuit negative plate voltage V− and of an appropriate calibration curve, previously determined during a calibration procedure. A charge calibration curve is used for SOC estimation on the basis of the measured open circuit negative plate voltage if the sign of the current is representative of a charge prior to cut-off and a discharge calibration curve is used if the sign of the current is representative of a discharge prior to cut-off.

In order to obtain SOC results with the best accuracy, calibration should theoretically be performed individually for each type, size and design of the lead acid cell. The calibration procedure should however be as fast and simple as possible. As shown in FIGS. 8 and 9, both the junction potential Ej and the open circuit negative plate voltage V− are not linear functions of the state of charge SOC of the battery, so that straight calibration lines should not be used.

The curve representing the junction potential Ej versus SOC in FIG. 8, or respectively versus the electrolyte concentration, actually corresponds to a monotonic function. It can be interpolated with a very good accuracy with a second order polynomial, i.e. a parabola. Through interpolation according to a Taylor series representation of the Ej(SOC) function around the point corresponding to SOC=50% up to the second degree, it is for example possible to obtain the following second degree equation between the junction potential Ej and the SOC corresponding to FIG. 8:

$$Ej = -7.078 \cdot 10^{-7}(SOC)^2 + 2.38 \cdot 10^{-4}(SOC) - 1.738 \cdot 10^{-2} \quad (5)$$

A similar approach can be applied to both the charge and discharge calibration curves. FIG. 9 shows two charge calibration curves C1 (continuous line) and C2 (dotted line) and two discharge calibration curves D1 (continuous line) and D2 (dotted line). One pair of charge calibration curve C1 and discharge calibration curve D1 has been generated by a first type of procedure for generation of calibration curves, while the other pair of charge calibration curve C2 and discharge calibration curve D2 has been generated by a second type of procedure.

The first and more accurate type of calibration procedure includes all experimental points measured in the SOC domain between 5% and 95% and the corresponding calibration curve (C1 or D1) is calculated by linear least squares regression with second order polynomial.

The second type of calibration procedure takes into account only three experimental points, respectively at low, medium and high SOC values. These three calibration points are actually sufficient to build a second order interpolation polynomial. The three optimal SOC values for generation of a sufficiently accurate calibration polynomial are then at partial states of charge respectively comprised between 5 and 10%, between 43 and 47% and between 80 and 85%. The calibration procedure should then use a well charged lead acid battery, which is first galvanostatically totally discharged, to 100% depth of discharge, with at least three 5 min interruptions in the above mentioned SOC domains (5-10%, 43-47% and 80-85%), and is thereafter galvanostatically charged with at least three 5 min interruptions periods in the same three SOC domains. The battery is considered as fully discharged when the measured open circuit voltage V– is more positive than the value corresponding to SOC=0%.

The second fast three-points calibration procedure gives a good enough accuracy when compared with the full, but slower, first calibration procedure.

After calibration, the estimation of SOC of the battery can be obtained on the basis of the following calibration polynomial representative of the corresponding calibration curve:

$$SOC = k_2(V-)^2 + k_1(V-) + k_0 \quad (6)$$

wherein the coefficients $k_0$, $k_1$ and $k_2$ are calculated during the calibration procedure. These coefficients can advantageously be obtained either by linear least squares regression in the first calibration procedure (with more than three calibration points for each calibration curve) or by the following equations in the three-points calibration procedure:

$$k_2 = (S_0 f_1 + S_2 f_0 + S_1 f_2 - S_2 f_1 - S_0 f_2 - S_1 f_0)/(f_0^2 f_1 + f_1^2 f_2 + f_2^2 f_0 - f_2^2 f_1 - f_0^2 f_2 - f_1^2 f_0) \quad (7)$$

$$k_1 = (S_1 f_0^2 + S_0 f_2^2 + S_2 f_1^2 - S_1 f_2^2 - S_0 f_1^2 - S_2 f_0^2)/(f_0^2 f_1 + f_1^2 f_2 + f_2^2 f_0 - f_2^2 f_1 - f_0^2 f_2 - f_1^2 f_0) \quad (8)$$

$$k_0 = (S_2 f_0^2 f_1 + S_0 f_1^2 f_2 + S_1 f_2^2 f_0 - S_0 f_2^2 f_1 - S_2 f_1^2 f_0 - S_1 f_0^2 f_2)/(f_0^2 f_1 + f_1^2 f_2 + f_2^2 f_0 - f_2^2 f_1 - f_0^2 f_2 - f_1^2 f_0) \quad (9)$$

wherein $S_0$, $S_1$ and $S_2$ are the three calibration values of SOC, and $f_0$, $f_1$ and $f_2$ are the corresponding values of the open circuit negative plate voltage V–.

If the accuracy of the voltmeter used for the measurement of the open circuit voltage is +/–0.5 mV, i.e. in the millivolt scale, then the three-points calibration procedure is recommended. On the contrary, if the accuracy of the voltmeter is higher (for example +/–0.1 mV) then the calibration could advantageously be done with more than 3 points in order to achieve a higher accuracy in the SOC estimation.

When the values $k_0$, $k_1$ and $k_2$ are available, the whole corresponding calibration curve SOC(V–) can be generated numerically for SOC values up to 100% and down to 0% and stored in a memory of a battery monitoring circuit. The estimation of the state of charge of the battery can then be performed by a simple comparison between the measured open circuit negative plate voltage V– and the appropriate digitalized charge or discharge calibration curve.

As shown in FIG. 9, the open circuit negative plate voltage values V– vary at least within a 20 mV region for each calibration curve (about 20 mV for the charge calibration curves C1 and C2 and slightly more than 30 mV for the discharge calibration curves D1 and D2). Thus, when the negative plate voltage measurement is performed with an accuracy of +/–0.5 mV, the full-scale of SOC values will consist in at least 20 points and the error on the SOC estimation will at the utmost be approximately 5%.

The calibration procedure preferably comprises determination of a pair of calibration curves (charge and discharge) for each of a plurality of ambient temperatures. The estimation of the SOC then comprises a measure of the temperature and the choice of the pair of calibration curves associated to the measured temperature. A pair of calibration curves for each interval of 10° C. (15±5° C., 25±5° C., etc.) is enough to maintain the SOC error in the range of 5%.

Figure 10:
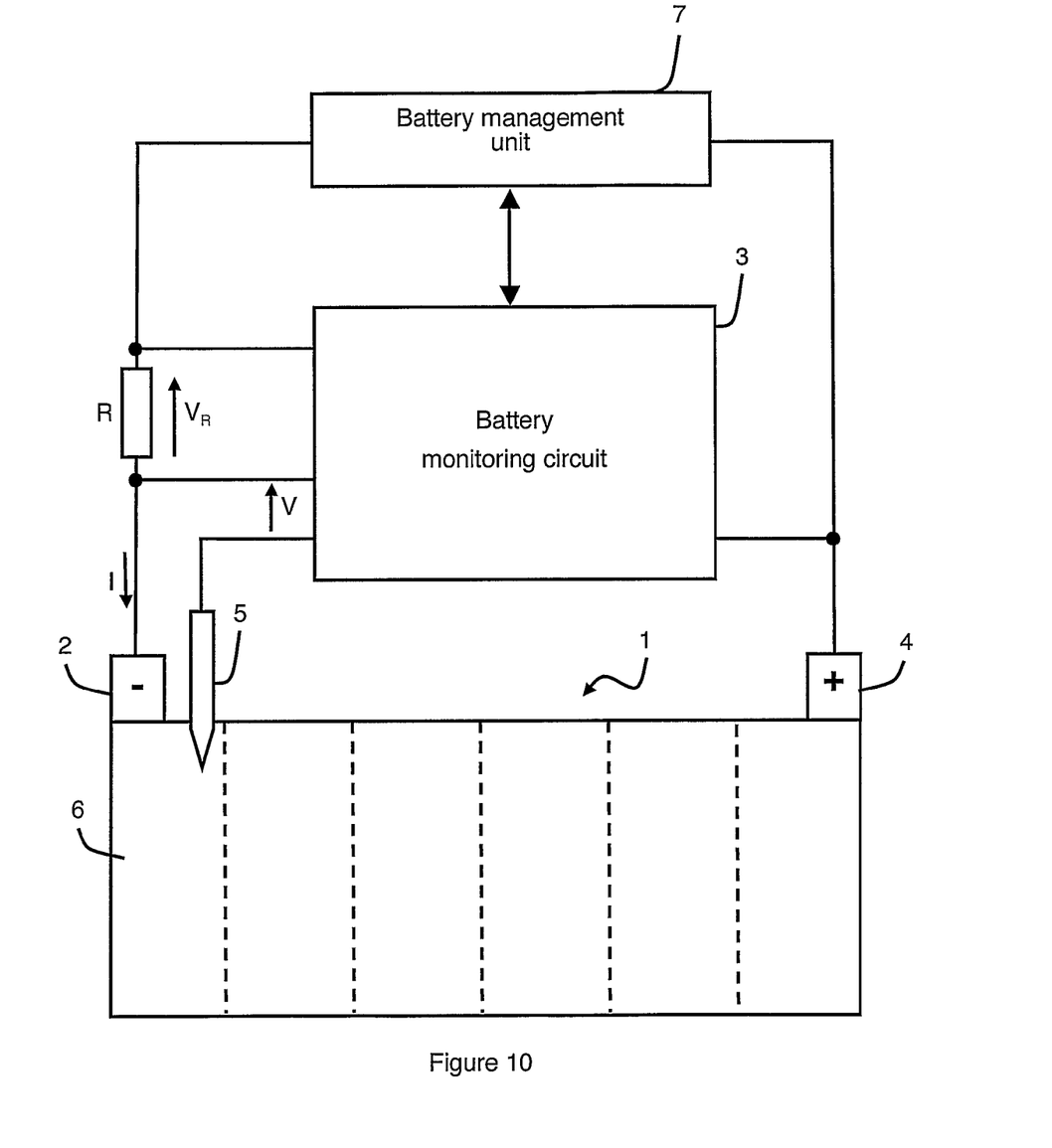
FIG. 10 schematically illustrates a device for carrying out the method according to the invention.

In the specific embodiment of FIG. 10, the lead acid battery 1 classically comprises a plurality of cells. The sign of the current I through the battery 1 prior to cut-off is obtained by measuring the sign of the voltage $V_R$ across a shunt R connected in series with the negative terminal 2 of the battery. The battery monitoring circuit 3 is connected to both terminals of the shunt R, to the negative terminal 2 of the battery, to the positive terminal 4 of the battery and to a reference electrode 5, preferably integrated in the last cell 6, near the negative terminal 2. The battery monitoring circuit 3 is also preferably connected by a bidirectional data link to a battery management unit 7, connected to the positive battery terminal 4 and to the negative terminal 2 via the shunt R.

The battery monitoring circuit 3 thus measures the voltage across the shunt R, which is part of the power supply connection between the negative battery terminal 2 and the battery management unit 7, and the voltage difference between the negative terminal 2 and the reference electrode 5, i.e. the negative plate voltage V–.

The connection of the battery monitoring circuit 3 and of the battery management unit 7 (if any) to the positive battery terminal 4 is intended, together with its connection to negative battery terminal 2, to insure power supply of circuit 3 and unit 7. However, this connection to the positive battery terminal is interrupted during the 5 min cut off period during which the open circuit voltage difference between the reference electrode 5 and the negative battery terminal 2 is measured for SOC estimation. Thus, at least the battery monitoring circuit 3 should also be supplied by a small auxiliary battery (not represented in FIG. 10), supplying for example about 100 mAh, to ensure the operation of the battery monitoring circuit during this 5 min cut off period. Outside this cut-off period, the auxiliary battery can stay on a floating regime of charge.

In a preferred embodiment, the battery monitoring circuit 3 can be inserted in the top of the battery case.

As described above, the battery monitoring circuit 3 can estimate the state of charge of the battery. In a preferred embodiment, the battery monitoring circuit can further determine an estimation of the water loss of the battery and/or an estimation of the state of health (SOH) of the battery if the corresponding battery management unit 7 is able to send to circuit 3 information representative of the end of the charge and of the end of the discharge. The battery monitoring circuit 3 then acts as a full battery state monitor. The estimated values of the SOC, SOH and water loss can be displayed, for example on three different scales, which can be integrated in the battery monitoring circuit 3 or in the battery management unit 7.

During overcharge of a lead-acid battery, water is decomposed into hydrogen and oxygen. Thus, when the battery reaches full charge after some charge/discharge cycles, the electrolyte concentration is higher than the initial one. This leads to an open circuit negative plate voltage V− that is more negative than the open circuit negative plate voltage corresponding to a 100% SOC of the charge calibration curve. The difference between the absolute values of these voltages is approximately equal to the junction potential Ej in equation (4). Thus, such a measured increase of the absolute value |V−| of the open circuit negative plate voltage can be converted in an estimated water loss as disclosed below and displayed.

Figure 11:
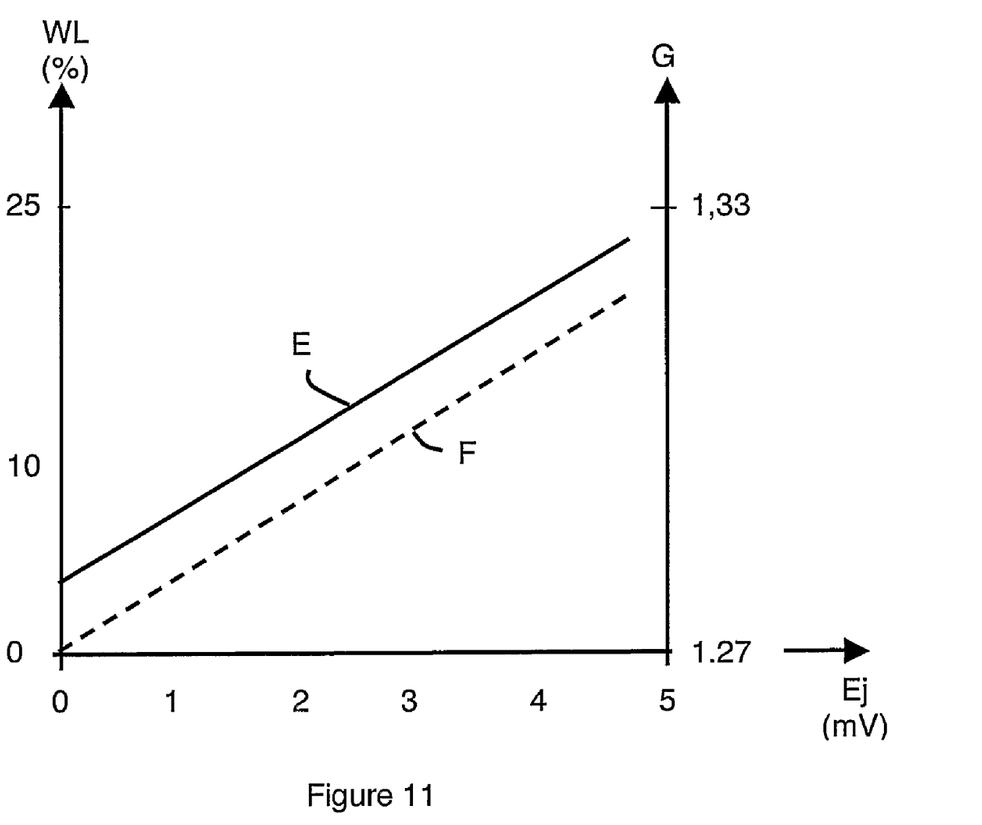
FIG. 11 illustrates the variation of the relative water loss of the electrolyte (curve E) and the specific gravity G of the electrolyte (curve F) versus the theoretical junction potential Ej of the lead acid battery.

Curve E of FIG. 11 represents the calculated variations of the relative water loss WL (in %), i.e. the water loss normalized to the initial weight of the water in the electrolyte at SOC=100%, versus the theoretical junction potential Ej. Curve F of FIG. 11 represents the variations of the electrolyte specific gravity G at SOC=100% versus Ej. As shown in FIG. 11, a junction potential increase of 4.5 mV corresponds to a water loss of about 20%, and to an increase of the specific gravity of about 1.325. This is representative of a substantial electrolyte starving.

Both curves E and F are nearly linear and have respectively a slope of 4.2% per millivolt and 0.0098 per millivolt. It is thus easy to calculate the water loss, either in terms of relative water loss WL on the basis of an increase of 4.2% per millivolt of increase of the open circuit junction potential Ej or in term of specific gravity G on the basis of an increase of 0.0098 per millivolt of increase of the open circuit junction potential Ej, i.e. of a corresponding increase of the difference between the absolute values of the measured open circuit negative plate voltage (|V−|) and of the corresponding voltage of the charge calibration curve representative of a 100% state of charge.

The state of health (SOH) of a battery can be defined as the irreversible loss of the battery capacity. Considering the changes in the electrolyte concentration during the battery ageing, there are two major different mechanisms of capacity loss. The first leads to the impossibility to charge the battery, due to irreversible or hard sulphation, while the second one leads to impossibility to discharge the battery, due to the development of various phenomena like loss of activity of the expander in the active mass of the negative electrode, softening and shedding of the active mass of the positive electrode, positive grid corrosion etc. To measure the state of health of the battery, the battery monitoring circuit 3 must receive from the associated battery management unit 7, responsible for the charge and discharge of the battery, signals or data representative of the end of the charge and of the end of the discharge in a relatively short period of time, i.e. within 1 to 3 days or within 1 to 3 charge/discharge cycles.

When the battery monitoring circuit 3 receives from the battery management unit 7 the indication that the charge is over, it estimates the corresponding state of charge, i.e. the apparent state of charge at the end of the charge $SOC_{app}^{ch}$. If the battery is completely charged, this value should be equal to 100%. But, if part of the active material is sulphated, the acid concentration in the cell will be too low and the estimated $SOC_{app}^{ch}$ will be less than 100%. The apparent state of charge at the end of the charge can be defined as the partial state of health at the end of the charge ($PSOH^{ch}$), representative of the sulphation of the battery:

$$PSOH^{ch}=SOC_{app}^{ch} \qquad (10)$$

Similarly, when the battery monitoring circuit 3 receives from the battery management unit 7 the indication that the discharge is over, it estimates the corresponding state of charge, i.e. the apparent state of charge at the end of the discharge $SOC_{app}^{dsch}$. If the battery is completely discharged this value should be equal to 0%. If some degradation phenomena limit the complete discharge of the battery at the end of the discharge, then the estimated $SOC_{app}^{dsch}$ will be more than 0% and this value can be used to calculate the partial state of health at the end of the dicharge ($PSOH^{dsch}$):

$$PSOH^{dsch}=100-SOC_{app}^{dsch} \qquad (11)$$

Then the complete state of health value SOH can be calculated as follows:

$$SOH=PSOH^{ch}+PSOH^{dsch}-100=SOC_{app}^{ch}-SOC_{app}^{dsch} \qquad (12)$$

For example, if the battery has 10% of capacity loss due to sulphation, then $PSOH^{ch}=SOC_{app}^{ch}=90\%$. If the battery further has 10% of capacity loss due to shedding of active materials, then $SOC_{app}^{dsch}=10\%$ and, according to equation (12), the state of health SOH of the battery is 80%.

The invention claimed is:

1. Method of estimation of the state of charge of a lead acid battery comprising an integrated liquid junction reference electrode, said method comprising:
   measurement of the open circuit voltage difference between the reference electrode and a negative battery terminal during at least one cut-off period,
   determination of the sign of the current though the battery prior to cut-off, and
   estimation of the state of charge on the basis of said open circuit voltage difference and, according to said sign, respectively of a charge or a discharge calibration curve, previously determined during a calibration procedure.

2. Method according to claim 1, wherein said sign determination comprises measurement of the sign of the voltage across a shunt connected in series with the negative battery terminal.

3. Method according to claim 1, wherein said cut-off period has a duration of at least 5 min.

4. Method according to claim 1, wherein said reference electrode is an $Ag/Ag_2SO_4$, $Hg/Hg_2SO_4$ or $Cu/CuSO_4$ reference electrode.

5. Method according to claim 1, wherein the calibration procedure comprises determination of a pair of charge and discharge calibration curves for each of a plurality of temperatures of the negative terminal, said method further comprising measurement of the temperature of the negative terminal and said estimation being based on said pair of charge and discharge calibration curves associated with said measured temperature.

6. Method according to claim 1, wherein said calibration procedure comprises at least three calibration points respectively at high, medium and low partial states of charge and calculation of coefficients of the calibration curve as a second order polynomial.

7. Method according to claim 6, wherein said high, medium and low partial states of charge respectively correspond to a state of charge comprised between 80 and 85%, between 43 and 47%, and between 5 and 10%.

8. Method according to claim 1, comprising estimation of water loss when the absolute value of the measured open circuit voltage difference exceeds the absolute value of the corresponding voltage difference of the charge calibration curve representative of a 100% state of charge, said water loss being a function of the difference between said absolute values.

9. Method according to claim 8, wherein 1 mV increase of said absolute values difference is equivalent to 4.2% relative water loss or to an increase of 0.0098 of the specific gravity of the electrolyte.

10. Method according to claim 1, comprising determination of first and second state of charge values, respectively at the end of a charge and of a discharge, the difference between said first and second state of charge values being representative of an estimated state of health of the battery.

11. Method according to claim 10, wherein said first and second state of charge values are measured within 1 to 3 days or within 1 to 3 charge/discharge cycles.

* * * * *

UNITED STATES PATENT AND TRADEMARK OFFICE
CERTIFICATE OF CORRECTION

PATENT NO. : 7,795,874 B1  Page 1 of 1
APPLICATION NO. : 12/679446
DATED : September 14, 2010
INVENTOR(S) : Angel Zhivkov Kirchev It is certified that error appears in the above-identified patent and that said Letters Patent is hereby corrected as shown below:

Title Page, above Item (51) please include the following Prior Publication Data, as shown below:

(65) Prior Publication Data

U.S. 2010/0213946 A1    Aug. 26, 2010

Please amend claim 1, col. 8. line 31 as shown below:

"determination of the sign of the current ~~though~~through the battery"

Signed and Sealed this

Thirtieth Day of November, 2010

David J. Kappos
*Director of the United States Patent and Trademark Office*